US009679638B2

(12) United States Patent
Lee

(10) Patent No.: US 9,679,638 B2
(45) Date of Patent: Jun. 13, 2017

(54) SEMICONDUCTOR DEVICE AND METHOD OF OPERATING THE SAME

(71) Applicant: SK hynix Inc., Gyeonggi-do (KR)

(72) Inventor: Hee Youl Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 107 days.

(21) Appl. No.: 14/667,312

(22) Filed: Mar. 24, 2015

(65) Prior Publication Data

US 2016/0125935 A1 May 5, 2016

(30) Foreign Application Priority Data

Nov. 4, 2014 (KR) .................. 10-2014-0152397

(51) Int. Cl.
G11C 11/56 (2006.01)
G11C 16/34 (2006.01)
G11C 16/10 (2006.01)
G11C 16/12 (2006.01)
G11C 16/24 (2006.01)

(52) U.S. Cl.
CPC .......... *G11C 11/5628* (2013.01); *G11C 16/10* (2013.01); *G11C 16/12* (2013.01); *G11C 16/24* (2013.01); *G11C 16/3459* (2013.01); *G11C 2211/5621* (2013.01)

(58) Field of Classification Search
CPC ................. G11C 11/5628; G11C 16/3459
See application file for complete search history.

(56) References Cited

U.S. PATENT DOCUMENTS

2011/0158000 A1* 6/2011 Cho .................. G11C 16/3454
365/185.22

FOREIGN PATENT DOCUMENTS

KR 1020090010481 1/2009
KR 1020120069114 6/2012

* cited by examiner

Primary Examiner — Tri Hoang
(74) Attorney, Agent, or Firm — IP & T Group LLP

(57) ABSTRACT

A semiconductor device and a method of operating the same are provided. The method includes performing a program operation on a memory cell so that a threshold voltage of the memory cell is greater than a main verifying voltage, and while the program operation is performed, a bit line voltage applied to a bit line connected to the memory cell gradually increases based on the threshold voltage of the memory cell and the number of times a program voltage is applied to a word line connected to the memory cell.

8 Claims, 9 Drawing Sheets

SEMICONDUCTOR DEVICE AND METHOD OF OPERATING THE SAME

CROSS-REFERENCE TO RELATED APPLICATION

The present application claims priority to Korean Patent Application Number 10-2014-0152397, filed on Nov. 4, 2014, the entire disclosure of which is herein incorporated by reference in its entirety.

BACKGROUND

Field of Invention

The present invention relates to a semiconductor device and a method of operating the same. More specifically, the present invention relates to a method of programming a semiconductor device.

Description of Related Art

A semiconductor memory device includes a memory cell array in which data is stored. The memory cell array includes a plurality of memory blocks, and each memory block includes a plurality of memory cells.

A memory cell that stores one bit of data is referred to as a single-level cell (SLC), and technology for storing two or more bits of data in one memory cell is being studied to increase data capacity and reduce manufacturing costs. A memory cell that stores two bits of data is referred to as a multi-level cell (MLC), and a memory cell that stores three bits of data is referred to as a triple-level cell (TLC).

However, since performing program, read, and erase operations are complicated processes with multiple steps, as the number of bits stored in a memory cell increases, operating time may increase and the threshold voltage width of the memory cells may increase.

SUMMARY

Various embodiments are directed to a semiconductor device capable of improving reliability of a memory system including the same by decreasing the threshold voltage distributions of memory cells in a program operation, and a method of operating the same.

One aspect of the present invention provides a method of operating a semiconductor device, including: performing a program operation on a memory cell so that a threshold voltage of the memory cell is greater than a main verifying voltage, wherein, while the program operation is performed, a bit line voltage applied to a bit line connected to the memory cell gradually increases based on the threshold voltage of the memory cell and the number of times a program voltage is applied to a word line connected to the memory cell.

Another aspect of the present invention provides a method of operating a semiconductor device, including: performing a program operation on a memory cell so that a threshold voltage of the memory cell is greater than a main verifying voltage, wherein, while the program operation is performed, a plurality of pre-verifying operations using pre-verifying voltages which are lower than the main verifying voltage are performed, and a bit line voltage applied to a bit line connected to the memory cell gradually increases based on a result of the pre-verifying operations.

Still another aspect of the present invention provides a semiconductor device, including: a memory block including a plurality of memory cells; a peripheral circuit suitable for performing a program operation on a selected memory cell among the memory cells so that a threshold voltage of the selected memory cell is greater than a main verifying voltage; and a control circuit suitable for controlling the peripheral circuit while the program operation is performed, so that a bit line voltage applied to a bit line connected to the memory cell gradually increase based on the threshold voltage of the memory cell and the number of times a program voltage is applied to a word line connected to the memory cell.

Yet another aspect of the present invention provides a semiconductor device, including: a memory block including a plurality of memory cells; a peripheral circuit suitable for performing a program operation on a selected memory cell among the memory cells so that a threshold voltage of the selected memory cell is greater than a main verifying voltage; and a control circuit suitable for controlling the peripheral circuit while the program operation is performed, so that a plurality of pre-verifying operations using pre-verifying voltages, which are lower than the main verifying voltage, are performed and a bit line voltage applied to a bit line connected to the memory cell gradually increases based on a result of the pre-verifying operations.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION

Exemplary embodiments of the present invention will be described more fully hereinafter with reference to the accompanying drawings. The present invention may, however, be embodied in different forms and should not be construed as limited to the embodiments set forth herein. Exemplary embodiments of the present invention are described below in sufficient detail with reference to accompanying drawings to enable those of ordinary skill in the art to embody and practice the present invention.

Figure 1:
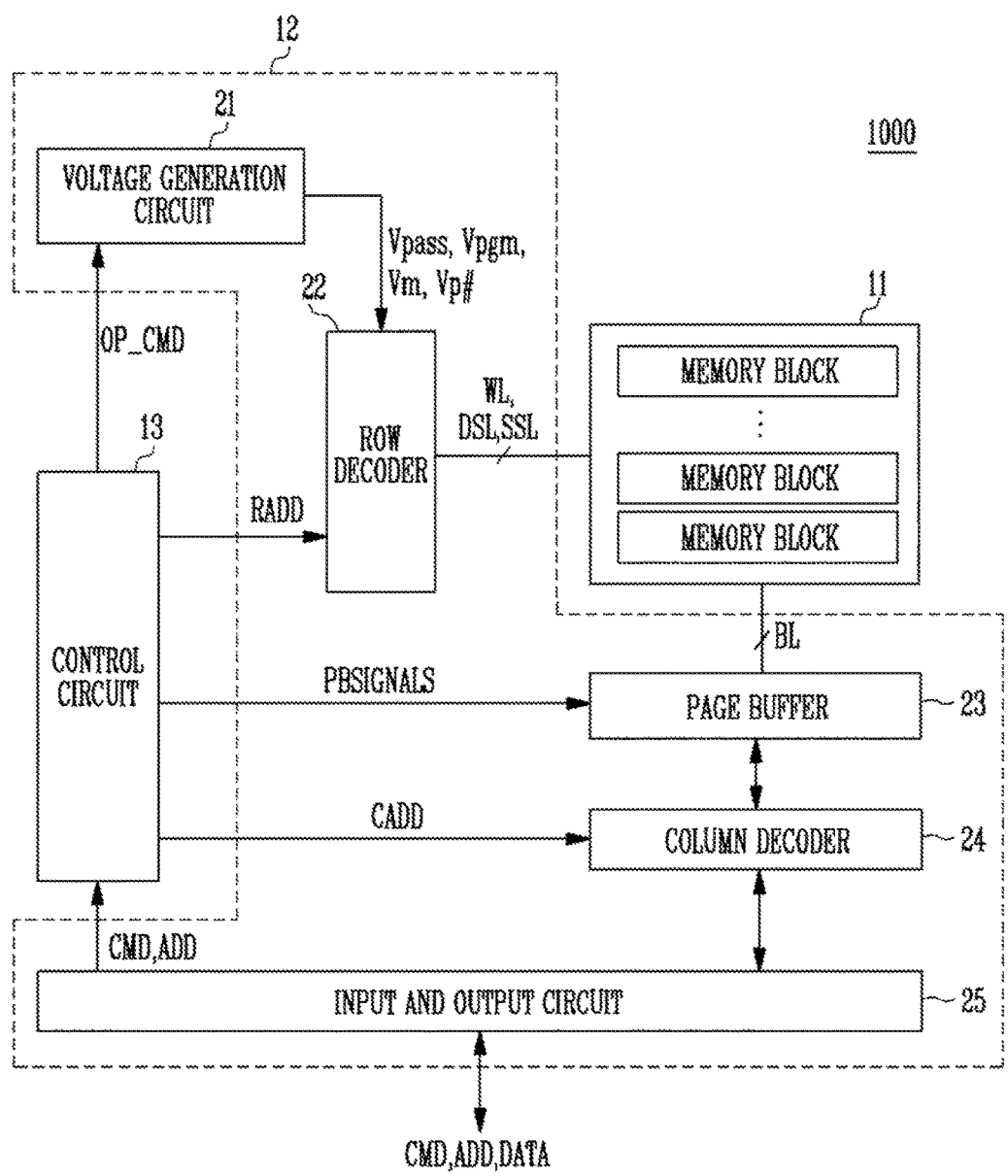
FIG. 1 is a block diagram illustrating a semiconductor device according to an exemplary embodiment of the present invention.

FIG. 1 is a block diagram Illustrating a semiconductor device according to an exemplary embodiment of the present invention.

Referring to FIG. 1, the semiconductor device 1000 may include a memory cell array 11 in which data is stored, a peripheral circuit 12 configured to perform program, read, and erase operations of the memory cell array 11, and a control circuit 13 configured to control the peripheral circuit 12.

The memory cell array 11 may include a plurality of memory blocks, and each memory block may be configured to have the same structure. The memory block may include a plurality of cell strings, and the cell strings may be formed in a two-dimensional structure or a three-dimensional structure. For example, the cell strings having the two-dimensional structure may be horizontally arranged on a semiconductor substrate, and the cell strings having the three-dimensional structure may be vertically arranged on the semiconductor substrate.

The peripheral circuit 12 may include a voltage generation circuit 21, a row decoder 22, a page buffer 23, a column decoder 24, and an input and output circuit 25.

The voltage generation circuit 21 may generate operating voltages having various levels in response to an operation command signal OP_CMD. The operation command signal OP_CMD may include a program command signal, a read command signal, and an erase command signal. For example, the voltage generation circuit 21 may generate program voltages Vpgm having various levels, a pass voltage Vpass, a main verifying voltage Vm, and pre-verifying voltages Vp# having various levels, and generate voltages having various other levels.

The row decoder 22 may select one of the memory blocks included in the memory cell array 11 in response to a row address RADD, and transfer the operating voltages to word lines WL, drain select lines DSL, and source select lines SSL, which are connected to the selected memory block.

The page buffer 23 may be connected to the memory blocks through bit lines BL, exchange data with the selected memory block during the program, read, and erase operations, and temporarily store the received data. The page buffer 23 may generate bit line voltages having various levels based on a page buffer control signals PBSIGNALS outputted from the control circuit 13 during the program operation, and apply the bit line voltages to the bit lines BL.

The column decoder 24 may exchange data with the page buffer 23 in response to a column address CADD.

The input and output circuit 25 may transfer a command signal CMD and an address ADD received from outside (e.g. from an external source or device) to the control circuit 13, transfer data DATA received from the outside to the column decoder 24, and output data DATA received from the column decoder 24 to the outside or transfer the data DATA to the control circuit 13.

The control circuit 13 may control the peripheral circuit 12 to perform the program, read, and erase operations in response to the command signal CMD and the address ADD. Specifically, during the program operation, the control circuit 13 may control the peripheral circuit 12 so that the bit line voltage gradually increases based on a threshold voltage of a memory cell, or both of the threshold voltage of the memory cell and the number of times a program voltage is applied to a selected word line.

The program operation described above may be applied to a semiconductor device having a memory block with a three-dimensional structure or a two-dimensional structure. Each memory block will be described below in detail.

Figure 2:
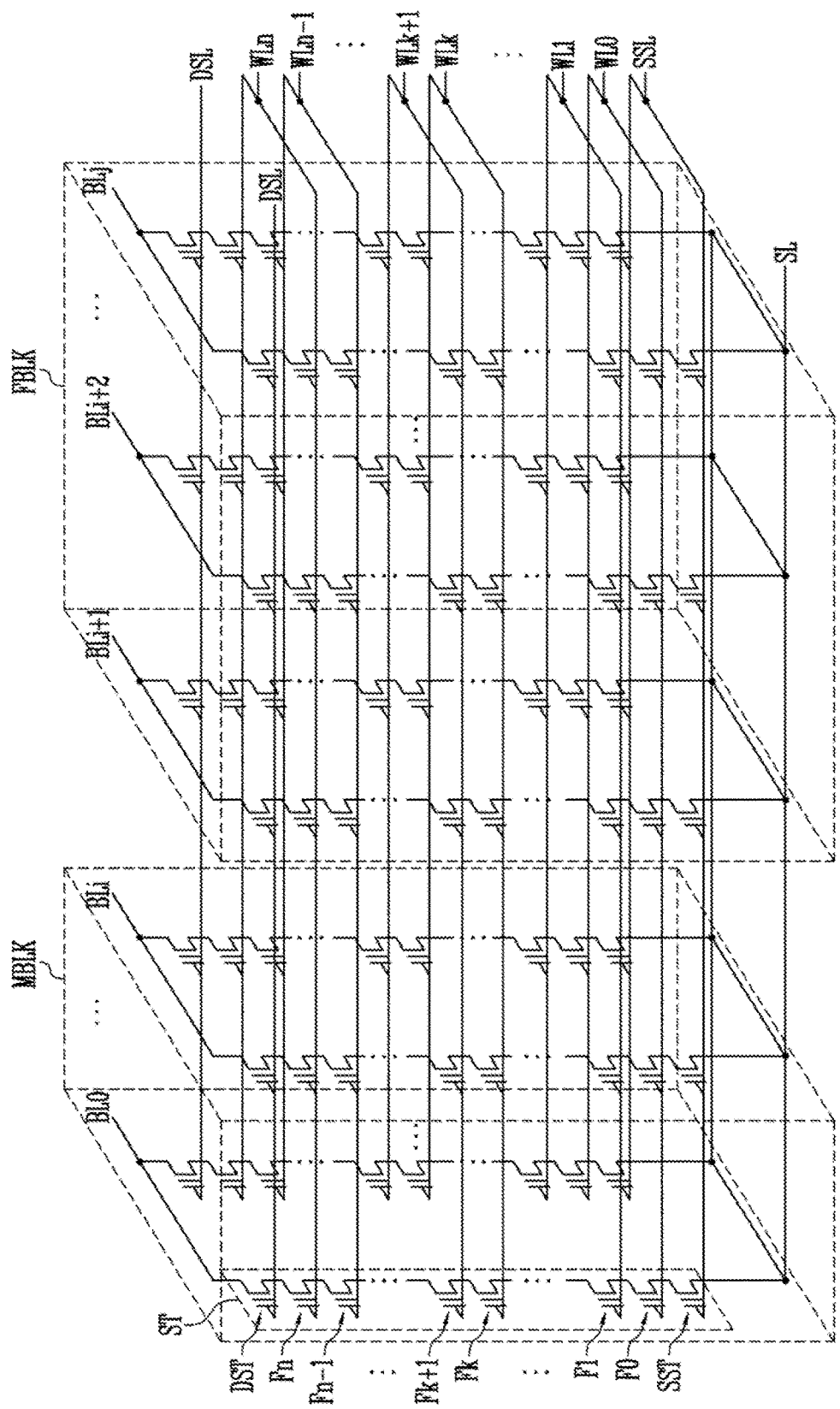
FIG. 2 is a circuit diagram illustrating a memory block having a three-dimensional structure according to an exemplary embodiment of the present invention.

FIG. 2 is a circuit diagram illustrating a memory block having a three-dimensional structure according to an exemplary embodiment of the present invention.

Referring to FIG. 2, the memory block having a three-dimensional structure may include a main block MBLK and a flag block FBLK. The main block MBLK and the flag block FBLK may store different kinds of data, and have the same structure. For example, normal data used by a user may be stored in normal memory cells of the main block MBLK, and flag data used in the semiconductor device may be stored in flag cells of the flag block FBLK. For example, the flag data may include data including least significant bit (LSB) or most significant bit (MSB) program performance information.

In the memory block having the three-dimensional structure, cell strings ST may be connected between bit lines BL0 to BLj and a source line SL, and be arranged vertically from the semiconductor substrate. In FIG. 2, the cell strings ST are implemented in a "T" shape, but may be implemented in a "U" shape.

The cell strings ST may include source select transistors SST, a plurality of memory cells F0 to Fn, and drain select transistors DST. The source select transistors SST may be connected between the source line SL and the memory cells F0, and the drain select transistors DST may be connected between the bit lines BL0 to BLj and the memory cells Fn. Gates of the source select transistors SST may be connected to a source select line SSL, gates of the memory cells F0 to Fn may be connected to word lines WL0 to WLn, respectively, and gates of the drain select transistors DST may be connected to drain select lines DSL.

A group of the memory cells connected to the same word line may be referred to as a page, and the program operation may be performed in units of pages.

Figure 3:
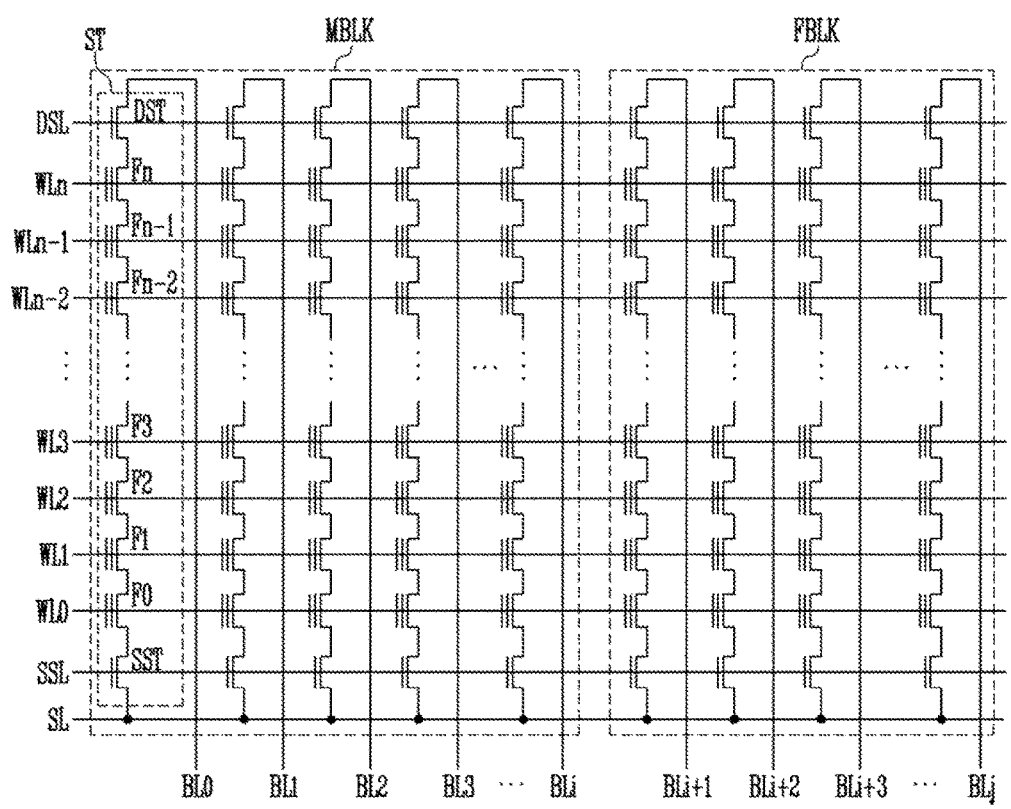
FIG. 3 is a circuit diagram illustrating a memory block having a two-dimensional structure according to an exemplary embodiment of the present invention.

FIG. 3 is a circuit diagram illustrating a memory block having a two-dimensional structure according to an exemplary embodiment of the present invention.

Referring to FIG. 3, the memory block having the two-dimensional structure may include a main block MBLK and a flag block FBLK. Since the main block MBLK and the flag block FBLK have been described in detail with reference to FIG. 2, another detailed description will be omitted.

In the memory block having the two-dimensional structure, cell strings ST may be connected between bit lines BL0 to BLj and a source line SL, and be horizontally arranged on a semiconductor substrate.

The cell strings ST may include source select transistors SST, a plurality of memory cells F0 to Fn, and drain select transistors DST. The source select transistors SST may be connected between the source line SL and memory cells F0, and the drain select transistors DST may be connected between the bit lines BL0 to BLj and the memory cells Fn. Gates of the source select transistors SST may be connected to a source select line SSL, gates of the memory cells F0 to Fn may be connected to word lines WL0 to WLn, respectively, and gates of the drain select transistors DST may be connected to drain select lines DSL.

A group of memory cells connected to the same word line may be referred to as a page, and a program operation may be performed in units of pages.

Figure 4:
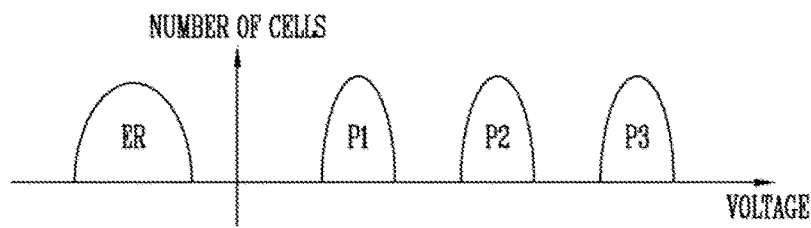
FIG. 4 is a diagram describing threshold voltage distributions of a multi-level cell according to an exemplary embodiment of the present invention.

FIG. 4 is a diagram describing threshold voltage distributions of a multi-level cell according to an exemplary embodiment of the present invention.

Referring to FIG. 4, a memory cell in which two bits of data is stored may be referred to as a multi-level cell (MLC), and the multi-level cell (MLC) may have four threshold distributions. For example, the multi-level cell (MLC) may enter an erase state ER, a first program state P1, a second program state P2, or a third program state P3 based on the threshold voltage distribution.

Figure 5:
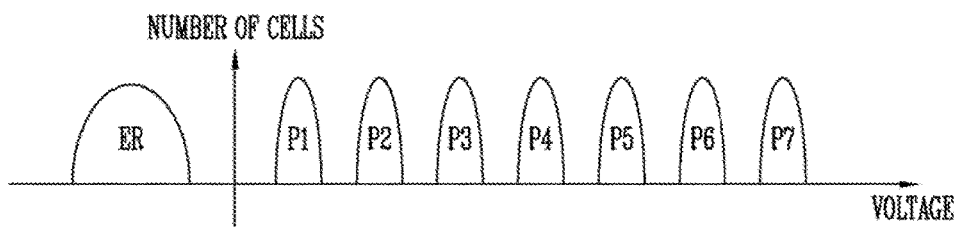
FIG. 5 is a diagram describing threshold voltage distributions of a triple-level cell according to an exemplary embodiment of the present invention.

FIG. 5 is a diagram describing threshold voltage distributions of a triple-level cell according to an exemplary embodiment of the present invention.

Referring to FIG. 5, a memory cell in which three bits of data is stored may be referred to as a triple-level cell (TLC), and the triple-level cell (TLC) may have eight threshold distributions. For example, the triple-level cell (TLC) may enter an erase state ER, a first program state P1, a second program state P2, a third program state P3, a fourth program state P4, a fifth program state P5, a sixth program state P6, or a seventh program state P7 based on the threshold voltage distribution.

As described above in detail with reference to FIGS. 4 and 5, since the multi-level cell (MLC) or the triple-level cell (TLC) may be programmed to enter one among the plurality of program states during the program operation, the width of the threshold voltage distributions becomes narrower. In order to decrease the width of the threshold voltage distributions of the memory cells which are programmed, the program operation may be performed as follows.

Figure 6:
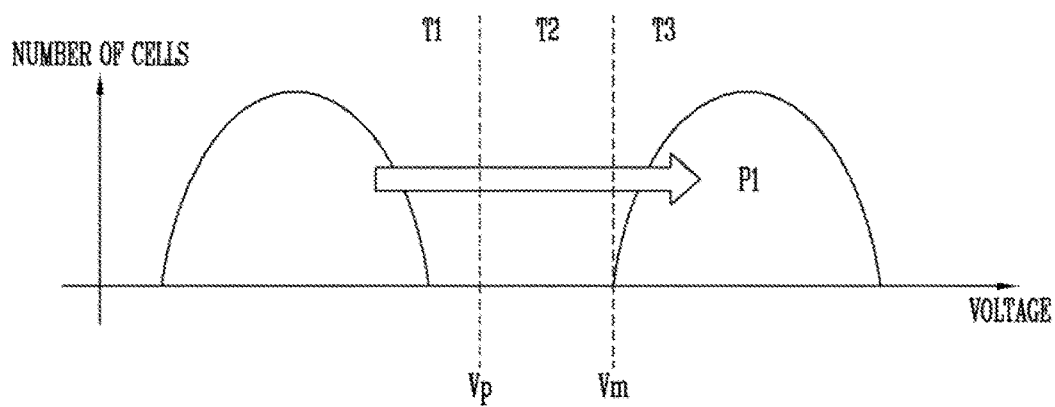
FIGS. 6 and 7 are diagrams describing a program operation according to an exemplary embodiment of the present invention.
Figure 7:
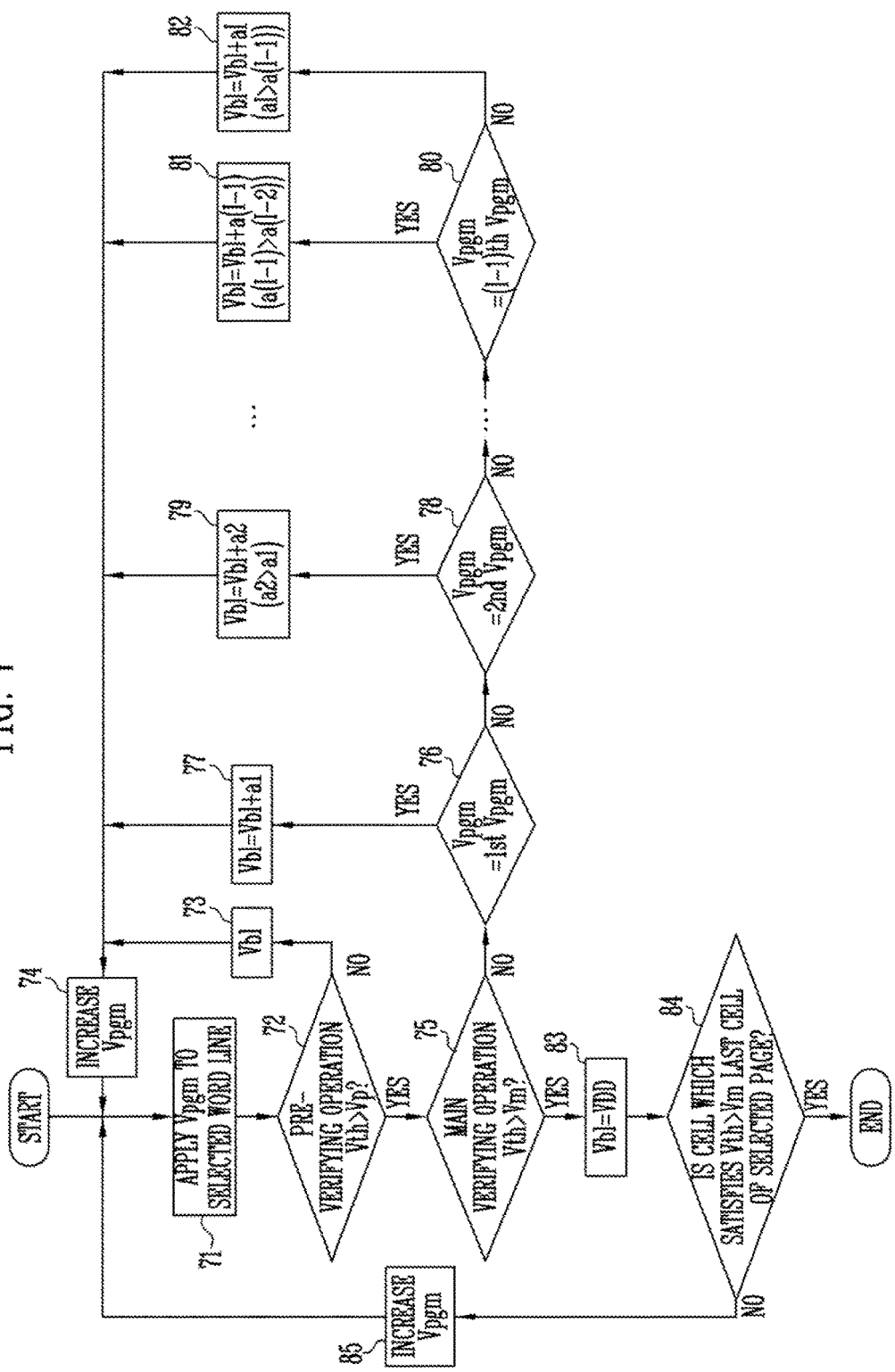

FIGS. 6 and 7 are diagrams describing a program operation according to an exemplary embodiment of the present invention. In FIGS. 6 and 7, a method of programming a selected memory cell to a first program state P1 will be explained as an example.

FIG. 6 is a diagram describing threshold voltages of the memory cells, and FIG. 7 is a flow chart describing a program operation in detail.

Referring to FIG. 6, the program operation may be performed in an incremental step pulse program (ISPP) manner, and a plurality of pre-verifying operations may be performed before performing a main verifying operation. Specifically, a bit line voltage applied to a bit line may vary based on a result of the pre-verifying operations. The bit line voltage may include a program permission voltage, a program suppression voltage, and a program prohibition voltage. The program permission voltage may be a voltage applied to a bit line connected to a memory cell having a threshold voltage equal to or lower than a pre-verifying voltage Vp and, for example, be a ground voltage. The program prohibition voltage may be a voltage applied to bit lines connected to memory cells having threshold voltages that are greater than a main verifying voltage Vm in the program operation, and be set to a power supply voltage. When the threshold voltage is between the pre-verifying voltage Vp and the main verifying voltage Vm in the program operation, the program suppression voltage may be applied to the bit line in order to reduce an increase in the rate of the threshold voltage.

For example, the program operation on the memory cells to be programmed to the first program state P1 may be ended when the main verifying operation of every selected memory cell is passed. However, in order to suppress an increase in the width of the threshold distributions of the memory cells before all of the main verifying operations of every select memory cell passes, the bit line voltage may vary based on the number of times the program voltage is applied to the word line. For this, the pre-verifying operation using the pre-verifying voltage Vp, which is lower than the main verifying voltage Vm, may be performed before performing the main verifying operation.

When the memory cells having the threshold voltage, which is equal to or lower than the pre-verifying voltage Vp, are detected in a first range T1 after performing the pre-verifying operation, the program permission voltage may be applied to the bit lines connected to the corresponding memory cells. For example, the program permission voltage may be a ground voltage. When the memory cells having the threshold voltage, which is greater than the pre-verifying voltage Vp, are detected after performing the pre-verifying operation, the main verifying operation may be subsequently performed. When the memory cells having the threshold voltage between the pre-verifying voltage Vp and the main verifying voltage Vm are detected in a second range T2, after performing the pre-verifying operation and the main verifying operation, the program suppression voltage may be applied to the bit lines connected to the corresponding memory cells. The program suppression voltage may be between the program permission voltage and the program prohibition voltage. Specifically, the program suppression voltage may fluctuate, and may vary based on the number of times the program voltage is applied to the selected word line. For example, the program suppression voltage may gradually increase in proportion to the number of times the program voltage is applied to the selected word line. When the memory cells having the threshold voltage, which is greater than the main verifying voltage Vm, are detected in a third range T3 after performing the main verifying operation, the program prohibition voltage may be applied to the bit lines connected to the corresponding memory cells. For example, the program prohibition voltage may become the power supply voltage.

The program operation described above will be described in greater detail below.

Referring to FIG. 7, when the program operation on the selected page starts, the threshold voltage of the selected memory cell may be increased by applying the program voltage Vpgm to the selected word line at step 71. When the program voltage Vpgm is first applied to the selected word line, the program permission voltage may be applied to the bit line connected to the selected memory cell, and the program prohibition voltage may be applied to the bit lines connected to the non-selected memory cells. In the program operation of the ISSP manner, since the program voltage gradually increases, a first program voltage that is first applied to the selected word line may become the lowest program voltage.

After the program voltage Vpgm is applied to the selected word line during a predetermined time, the pre-verifying operation may be performed at step 72. In the pre-verifying operation in which the pre-verifying voltage Vp is applied to the selected word line, it may be determined whether the threshold voltage Vth of the selected memory cell is greater than the pre-verifying voltage Vp. When it is determined that the threshold voltage Vth of the selected memory cell is equal to or lower than the pre-verifying voltage Vp based on a result of the pre-verifying operation at step 72 (NO), a predetermined bit line voltage Vbl may be applied to the bit line connected to the selected memory cell at step 73, and the program voltage Vpgm may be increased by a step voltage at step 74. Here, the bit line voltage Vbl may be the program permission voltage. The increased program voltage Vpgm may be applied to the selected word line at step 71, and the threshold voltage of the selected memory cell may be increased. The operations at steps 71, 72, 73, and 74 may be repeatedly performed until the threshold voltage Vth of the selected memory cell is greater than the pre-verifying voltage Vp. When it is determined that the threshold voltage Vth of the selected memory cell is greater than the pre-verifying voltage Vp, based on the result of the pre-verifying operation at step 72 (YES), the main verifying operation may be performed at step 75. In the main verifying operation at step 75, it may be determined whether the threshold voltage Vth of the selected memory cell is greater than the main verifying voltage Vm.

When it is determined that the threshold voltage Vth of the selected memory cell is equal to or lower than the main verifying voltage Vm, based on a result of the main operation at step 75 (NO), the number of times the program voltage Vpgm is applied to the selected word line may be counted at step 76. For example, when the main verifying operation starts, the counted number of the program voltages Vpgm applied to the selected word line may be set to 1. When it is determined that the program voltage Vpgm is the first program voltage 1st Vpgm at step 76, the bit line voltage Vbl may be increased by a1 V at step 77. The bit line voltage Vbl increased by a1 V may be a first program suppression voltage. The program voltage Vpgm may be increased by the step voltage at step 74, and the threshold voltage Vth of the selected memory cell may be increased by applying the program voltage Vpgm to the selected word line at step 71. That is, when the threshold voltage Vth of the selected memory cell is between the pre-verifying voltage Vp and the main verifying voltage Vm, the selected memory cell may be programmed in a state in which the first program suppression voltage Vbl+a1 is applied to the bit line connected to the selected memory cell at step 71. As such, the width of the threshold voltage distributions of the selected memory cell may be decreased by applying the first program suppression voltage Vbl+a1, which is greater than the program permission voltage Vbl, to the bit line. The number of times the program voltage Vpgm is applied to the selected word line may be increased when the selected memory cell is programmed in the state in which the first program suppression voltage Vbl+a1 is applied to the bit line at step 71. Accordingly, when the threshold voltage Vth of the selected memory cell is equal to or lower than the main verifying voltage Vm, based on the result of the main verifying operation at step 75 (NO), it may be determined whether the program voltage Vpgm is the first program voltage 1st Vpgm at step 76 and, if not, it may be determined whether the program voltage Vpgm is a second program voltage 2nd Vpgm at step 78.

When the program voltage Vpgm is the second program voltage 2nd Vpgm, the bit line voltage Vbl may be increased by a2 V at step 79. The a2 V may be greater than the a1 V. The bit line voltage Vbl increased by the a2 V may be the second program suppression voltage Vbl+a2.

When the threshold voltage Vth of the selected memory cell is equal to or lower than the main verifying voltage Vm, as described above, the number of times the program voltage Vpgm is applied to the selected word line may be counted, and the bit line voltage Vbl may be gradually increased in proportion to the counted number. However, a maximum increase in the level of the bit line voltage Vbl may be set, and the selected memory cell may be programmed while not increasing the bit line voltage Vbl after reaching the maximum increase level and gradually increasing only the program voltage Vpgm. For example, when it is determined that the program voltage Vpgm is the I-1-th program voltage (I-1)-th Vpgm, I being a positive integer, at step 80 (YES), an I-1-th suppression voltage Vbl+a(I-1) may be applied at step 81, and the selected memory cell may be programmed. On the other hand, when the program voltage Vpgm has the counted number which is greater than the I-1-th program voltage (I-1)-th Vpgm at step 80 (NO), the selected memory cell may be programmed while applying the constant I-th program suppression voltage Vbl+aI to the bit line at step 82 and gradually increasing the program voltage Vpgm before the threshold voltage Vth of the selected memory cell is greater than the main verifying voltage Vm at step 75.

When it is determined that the threshold voltage Vth of the selected memory cell is greater than the main verifying voltage Vm at step 75 (YES), the bit line voltage Vbl may be set to the program prohibition voltage, for example, a power supply voltage VDD at step 83. Next, it may be determined whether the selected memory cell is the last cell of the selected page at step 84. That is, when it may be determined that the memory cell having the threshold voltage Vth, which is greater than the main verifying voltage Vm, is the last memory cell at step 84 (YES), the program operation on the selected page may be ended. When the memory cell is not the last memory cell at step 84 (NO), the program voltage Vpgm may be increased by the step voltage at step 85, and the program operation may be performed until the threshold voltages of the remaining program target cells are greater than the main verifying voltage Vm. The program prohibition voltage may be applied to the bit line connected to the selected memory cell in which the program operation is ended until the program operation on every remaining memory cell is ended.

As described above, while programming the memory cell having the threshold voltage, which is between the pre-verifying voltage Vp and the main verifying voltage Vm, the bit line voltage gradually increases as the number of times the program voltage Vpgm is applied to the selected word line is increased. As a result, the variance of the threshold voltage of the memory cell in which the threshold voltage reaches the main verifying voltage Vm may be reduced. Accordingly, an increase in the width of the threshold voltage distributions of the memory cells may be suppressed.

Figure 8:
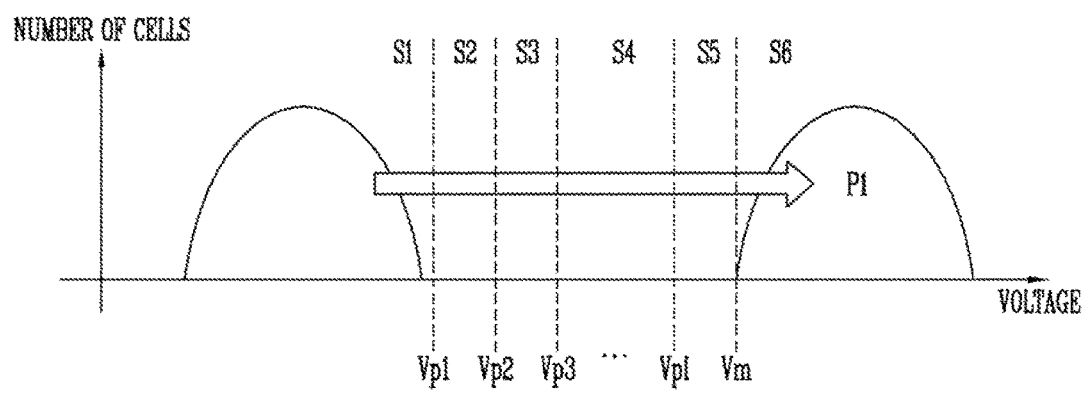
FIGS. 8 and 9 are diagrams describing a program operation according to another exemplary embodiment of the present invention.
Figure 9:
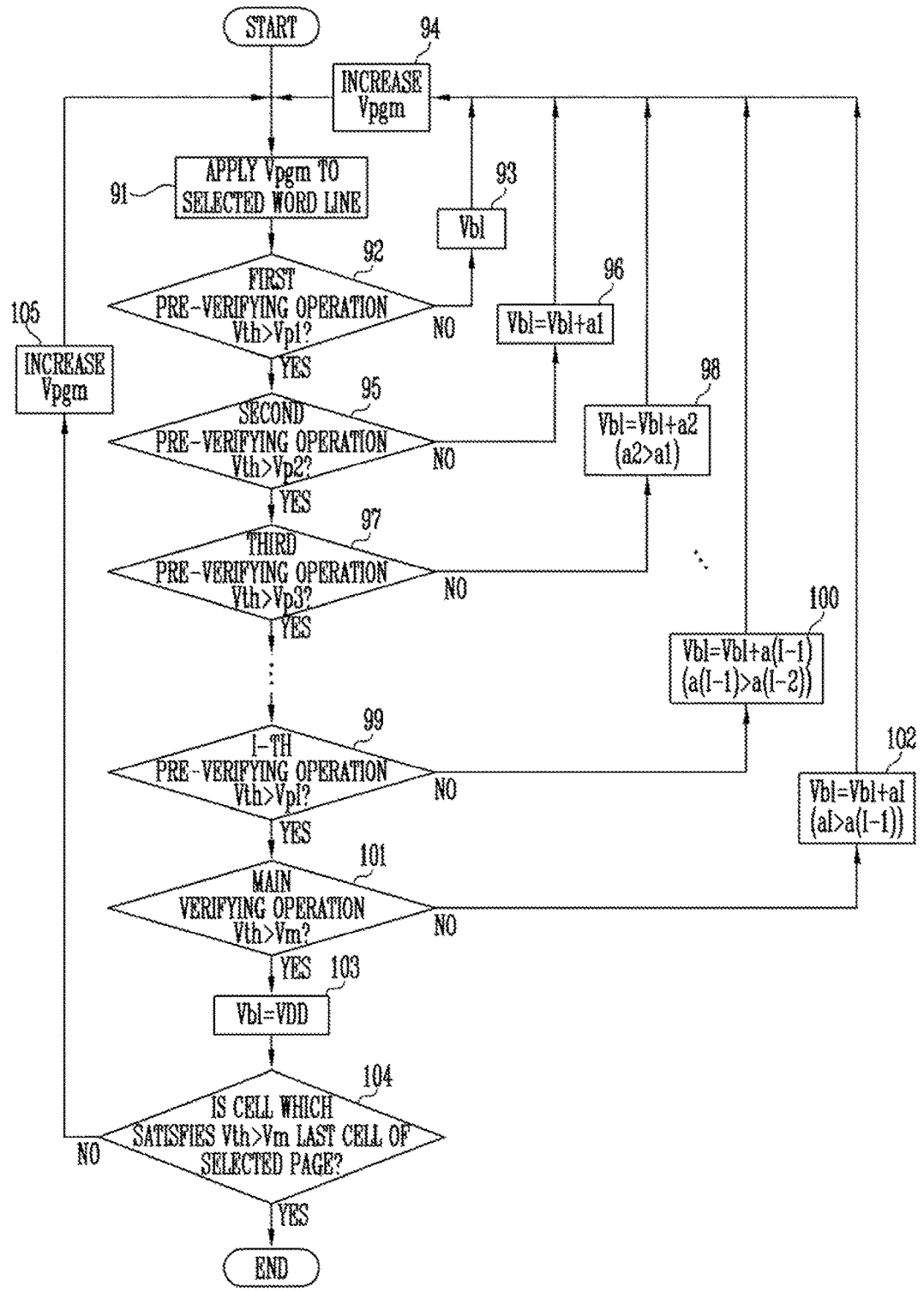

FIGS. 8 and 9 are diagrams describing a program operation according to another exemplary embodiment of the present invention. In FIGS. 8 and 9, a method of programming a selected memory cell to a first program state P1 will be explained as an example.

FIG. 8 is a diagram describing threshold voltages of memory cells, and FIG. 9 is a flow chart describing a program operation in detail.

Referring to FIG. 8, the program operation may be performed in an ISPP manner, and a plurality of pre-verifying operations may be performed before performing a main verifying operation. Specifically, a bit line voltage applied to a bit line may vary based on a result of the pre-verifying operations. The bit line voltage may include a program permission voltage, a program suppression voltage, and a program prohibition voltage. The program permission voltage may be a voltage applied to a bit line connected to a memory cell having a threshold voltage that is equal to or lower than the pre-verifying voltage Vp, and for example, be a ground voltage. The program prohibition voltage may be a voltage applied to bit lines connected to memory cells having threshold voltages that are greater than the main verifying voltage Vm in the program operation, and be set to a power supply voltage. When the threshold voltage is between the pre-verifying voltage Vp and the main verifying voltage Vm in the program operation, the program suppression voltage may be applied to the bit line in order to reduce an increase in rate of the threshold voltage.

For example, the program operation on the memory cells to be programmed to the first program state P1 may be ended when the main verifying operation of every selected memory cell passes. However, in order to suppress an increase in the width of the threshold distributions of the memory cells before the main verifying operation of every select memory cell passes, the plurality of pre-verifying operations using different pre-verifying voltages may be performed, and the bit line voltage may vary based on the result of the pre-verifying operations. For example, the pre-verifying operations may include first to I-th pre-verifying operations, I being a positive Integer. The first pre-verifying operation may use a first pre-verifying voltage Vp1 that is the lowest voltage among the pre-verifying voltages, the second pre-verifying operation may use a second pre-verifying voltage Vp2 that is greater than the first pre-verifying voltage, the third pre-verifying operation may use a third pre-verifying voltage Vp3 that is greater than the second pre-verifying voltage, and the I-th pre-verifying operation may use an I-th pre-verifying voltage VpI that is the greatest voltage among the pre-verifying voltages.

For example, by performing the first to I-th pre-verifying operations, a predetermined bit line voltage, for example, the program permission voltage, may be applied to the bit lines connected to the memory cells having a threshold voltage S1 which is equal to or lower than the first pre-verifying voltage Vp1, a first program suppression voltage may be applied to the bit lines connected to the memory cells having a threshold voltage S2 that is between the first pre-verifying voltage Vp1 and the second pre-verifying voltage Vp2, a second program suppression voltage may be applied to the bit lines connected to the memory cells having a threshold voltage S3 that is between the second pre-verifying voltage Vp2 and the third pre-verifying voltage Vp3, a program suppression voltage that is set to be gradually increased may be applied to the bit lines connected to the memory cells having a threshold voltage S4 that is between the third pre-verifying voltage Vp3 and the I-th pre-verifying voltage VpI, an I-th program suppression voltage may be applied to the bit lines connected to the memory cells having a threshold voltage S5 that is between the I-th pre-verifying voltage VpI and the main verifying voltage Vm, and the program prohibition voltage may be applied to the bit lines connected to the memory cells having a threshold voltage S6 that is greater than the main verifying voltage Vm. As described above, the program operation on the selected memory cells may be performed in a state in which the program permission voltage, the first to I-th program suppression voltages, or the program prohibition voltage, is applied each bit line.

The program operation described above will be described in greater detail below.

Referring to FIG. 9, when the program operation on the selected page starts, the threshold voltage of the selected memory cell may be increased by applying the program voltage Vpgm to the selected word line at step 91. When the program voltage Vpgm is first applied to the selected word line, the program permission voltage may be applied to the bit line connected to the selected memory cell, and the program prohibition voltage may be applied to the bit lines connected to the non-selected memory cells. In the program operation of the ISSP manner, since the program voltage gradually Increases, the first program voltage that is first applied to the selected word line may become the lowest program voltage.

After the program voltage Vpgm is applied to the selected word line during a predetermined time, the first pre-verifying operation may be performed at step 92. In the first pre-verifying operation, it may be determined whether the threshold voltage Vth of the selected memory cell is greater than the first pre-verifying voltage Vp1. When it is determined that the threshold voltage Vth of the selected memory cell is equal to or lower than the first pre-verifying voltage Vp1 based on a result of the pre-verifying operation at step 92 (NO), a predetermined bit line voltage Vbl may be applied to the bit line of the selected memory cell at step 93, and the program voltage Vpgm may be increased by a step voltage at step 94. At this time, the bit line voltage Vbl may be the program permission voltage. The threshold voltage of the selected memory cell may be increased by applying the increased program voltage Vpgm to the selected word line at step 91. The operations at steps 91, 92, 93, and 94 may be repeatedly performed until the threshold voltage Vth of the selected memory cell is greater than the first pre-verifying voltage Vp1. When it is determined that the threshold voltage Vth of the selected memory cell is greater than the first pre-verifying voltage Vp1 in the first pre-verifying operation at step 92 (YES), the second pre-verifying operation may be performed at step 95.

In the second pre-verifying operation at step 95, it may be determined whether the threshold voltage Vth of the selected memory cell is greater than the second pre-verifying voltage Vp2. The second pre-verifying voltage Vp2 may be greater than the first pre-verifying voltage Vp1. It may be determined whether the threshold voltage Vth of the selected memory cell is equal to or lower than the second pre-verifying voltage Vp2 based on a result of the second pre-verifying operation at step 95 (NO), and the bit line voltage Vbl may be increased by a1 V at step 96. The a1 V may be a positive voltage. The increased bit line voltage Vbl may be the first program suppression voltage Vbl+a1. Next, the program voltage Vpgm may be increased by the step voltage at step 94, and the threshold voltage Vth of the selected memory cell may be increased by applying the increased program voltage Vpgm to the selected word line at step 91. The operations at steps 91, 92, 95, 96, and 94 may be repeatedly performed until the threshold voltage Vth of the selected memory cell is greater than the second pre-verifying voltage Vp2. When it is determined that the threshold voltage Vth of the selected memory cell is greater than the second pre-verifying voltage Vp2 in the second pre-verifying operation at step 95 (YES), the third pre-verifying operation may be performed at step 97.

In the third pre-verifying operation at step 97, it may be determined whether the threshold voltage Vth of the selected memory cell is greater than the third pre-verifying voltage Vp3. The third pre-verifying voltage Vp3 may be greater than the second pre-verifying voltage Vp2. When it is determined that the threshold voltage Vth of the selected memory cell is equal to or lower than the third pre-verifying voltage Vp3 based on a result of the third pre-verifying operation at step 97 (NO), the bit line voltage Vbl may be increased by a2 V at step 98. The a2 V may be greater than the a1 V. The increased bit line voltage Vbl may be the second program suppression voltage Vbl+a2. Next, the program voltage Vpgm may be increased by the step voltage at step 94, and the threshold voltage Vth of the selected memory cell may be increased by applying the increased program voltage Vpgm to the selected word line at step 91. The operations described above may be repeatedly performed until the threshold voltage Vth of the selected memory cell is greater than the I−1-th pre-verifying voltage in the I−1-th pre-verifying operation. When it is determined that the threshold voltage Vth of the selected memory cell is greater than the I−1-th pre-verifying voltage in the I−1-th pre-verifying operation, the I-th pre-verifying operation may be performed at step 99. Here, I may be a positive integer.

In the I-th pre-verifying operation at step 99, it may be determined whether the threshold voltage Vth of the selected memory cell is greater than the I-th pre-verifying voltage VpI. The I-th pre-verifying voltage VpI may be greater than the I−1-th pre-verifying voltage. When it is determined that the threshold voltage Vth of the selected memory cell is equal to or lower than the I-th pre-verifying voltage VpI based on the result of the I-th pre-verifying operation at step 99 (NO), the bit line voltage Vbl may be increased by a(I−1) V at step 100. The a(I−1) V may be greater than the bit line voltage used in a previous pre-verifying operation. The increased bit line voltage Vbl may be the I−1-th program suppression voltage Vbl+a(I−1). Next, the program voltage Vpgm may be increased by the step voltage at step 94, and the threshold voltage Vth of the selected memory cell may be increased by applying the increased program voltage Vpgm to the selected word line at step 91. The operations at step 91 to 100 may be repeatedly performed until the threshold voltage Vth of the selected memory cell is greater than the I-th pre-verifying voltage VpI. The main verifying operation may be performed at step 101 when it is determined that the threshold voltage Vth of the selected memory cell is greater than the I-th pre-verifying voltage VpI at step 99 (YES).

In the main verifying operation at step 101, it may be determined whether the threshold voltage Vth of the selected memory cell is greater than the main verifying voltage Vm. The main verifying voltage Vm may be a final target voltage of the selected memory cell. The main verifying voltage Vm may be greater than the I-th pre-verifying voltage VpI. When it is determined that the threshold voltage Vth of the selected memory cell is equal to or lower than the main verifying voltage Vm based on a result of the main verifying operation at step 101 (NO), the bit line voltage Vbl may be increased by a1 V at step 102. The a1 V may be greater than the bit line voltage Vbl used in the I-th pre-verifying operation at step 99. The increased bit line voltage Vbl may be the I-th program suppression voltage Vbl+a1. Next, the program voltage Vpgm may be increased by the step voltage at step 94, and the threshold voltage Vth of the selected memory cell may be increased by applying the increased program voltage Vpgm to the selected word line at step 91. The operations at steps 91 to 102 may be repeatedly performed until the threshold voltage Vth of the selected memory cell is greater than the main verifying voltage Vm. When it may be determined that the threshold voltage Vth of the selected memory cell is greater than the main verifying voltage Vm in the main verifying operation at step 101 (YES), the bit line voltage connected to the corresponding memory cell may be the program prohibition voltage at step 103. The program prohibition voltage may be a power supply voltage VDD.

It may be determined whether the selected memory cell is the last cell of the selected page at step 104. When the selected memory cell is not the last cell of the selected page at step 104 (NO), since there are memory cells having threshold voltages which are lower than the main verifying voltage Vm among the memory cells of the selected page, the operations at steps 91 to 104 may be repeatedly performed until the threshold voltages Vth of the remaining memory cells are greater than the main verifying voltage Vm.

In operation at step 104, when it is determined that the selected memory cell is the last cell of the selected page at step 104 (YES), the program operation on the selected page may be ended.

Since the operations described above are related to the program operation on one memory cell, different pre-verifying operations may be performed on the plurality of memory cells based on the threshold voltage of each memory cell. Further, while the program operation on the selected page is performed, different bit line voltages may be applied to the bit lines connected to memory cells.

Figure 10:
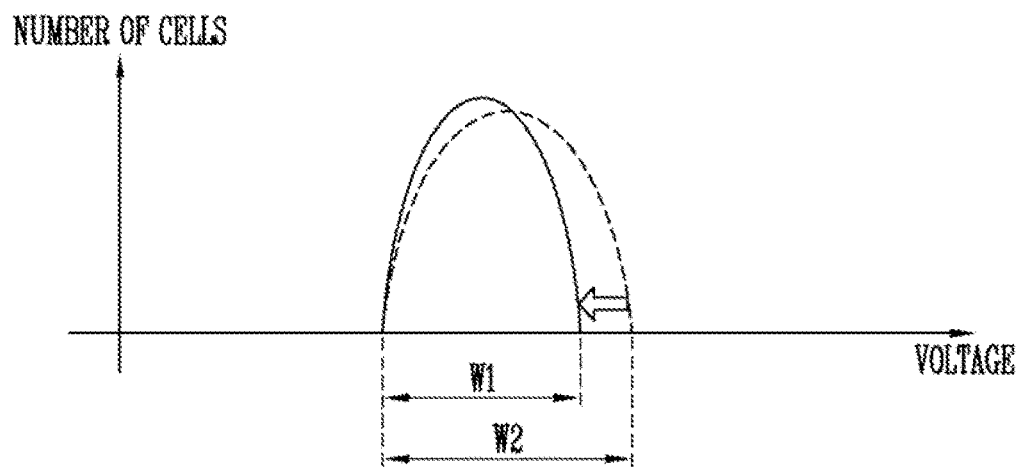
FIG. 10 is a diagram describing a threshold voltage of memory cells based on a program operation according to an exemplary embodiment of the present invention.

FIG. 10 is a diagram describing a threshold voltage of memory cells based on a program operation according to an exemplary embodiment of the present invention.

Referring to FIG. 10, the pre-verifying operation may be performed before the main verifying operation is performed, and when the bit line voltage is selectively increased based on the result of the pre-verifying operation, the width of the threshold voltage distributions of the memory cells may be reduced from W2 to W1. That is, as the threshold voltage reaches the main verifying voltage, a voltage difference between the program voltage and the bit line voltage may be decreased, an increase in rate of the threshold voltages of the memory cells may be reduced, and the width of the threshold voltage distributions may be reduced.

Figure 11:
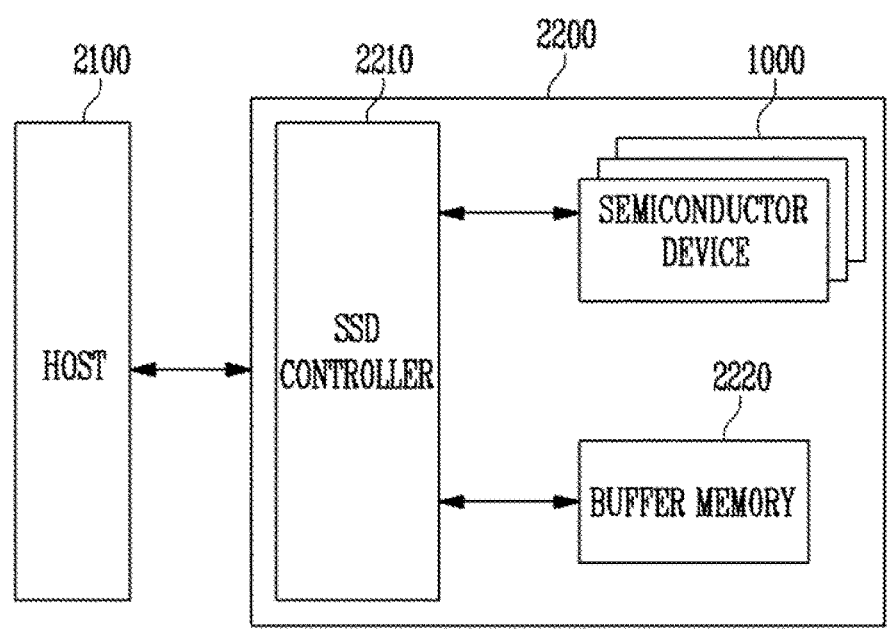
FIG. 11 is a block diagram illustrating a solid state drive including a semiconductor device according to an exemplary embodiment of the present invention.

FIG. 11 is a block diagram illustrating a solid state drive including a semiconductor device according to an exemplary embodiment of the present invention.

Referring to FIG. 11, a drive device 2000 may include a host 2100, and a solid state drive (SSD) 2200. The SSD 2200 may include an SSD controller 2210, a buffer memory 2220, and a semiconductor device 1000.

The SSD controller 2210 may provide a physical connection between the host 2100 and the SSD 2200. That is, the SSD controller 2210 may provide an interface with the SSD 2200 in response to a bus format of the host 2100. Specifically, the SSD controller 2210 may decode a command provided from the host 2100. The SSD controller 2210 may access the semiconductor device 1000 based on the decoded result. The bus format of the host 2100 may include a Universal Serial Bus (USB), a Small Computer System Interface (SCSI), a Parallel Component Interconnect (PCI)-Express, an Advanced Technology Attachment (ATA), a Parallel ATA (PATA), a Serial ATA (SATA), a Serial Attached SCSI (SAS), etc.

The buffer memory 2220 may temporarily store program data provided from the host 2100 or data read from the semiconductor device 1000. When data stored in the semiconductor device 1000 is cached in response to a read request from the host 2100, the buffer memory 2220 may support a cache function of directly providing the cached data to the host 2100. Generally, the data transmission speed by the bus format, for example, the SATA or SAS, of the host 2100 may be faster than the transmission speed of the SSD 2200. That is, when the interface speed of the host 2100 is faster than the transmission speed of the memory channels of the SSD 2200, performance degradation due to speed differences may be minimized by providing a buffer memory 2220 having a high capacity. The buffer memory 2220 may include synchronous dynamic random access memory (SDRAM) to provide sufficient buffering in the SSD 2200 used as an auxiliary memory device of high capacity.

The semiconductor device 1000 may include a storage medium of the SSD 2200. For example, the semiconductor device 1000 may include a non-volatile memory device having a high storage capacity, as described above in FIG. 1, and may include NAND-type flash memory.

Figure 12:
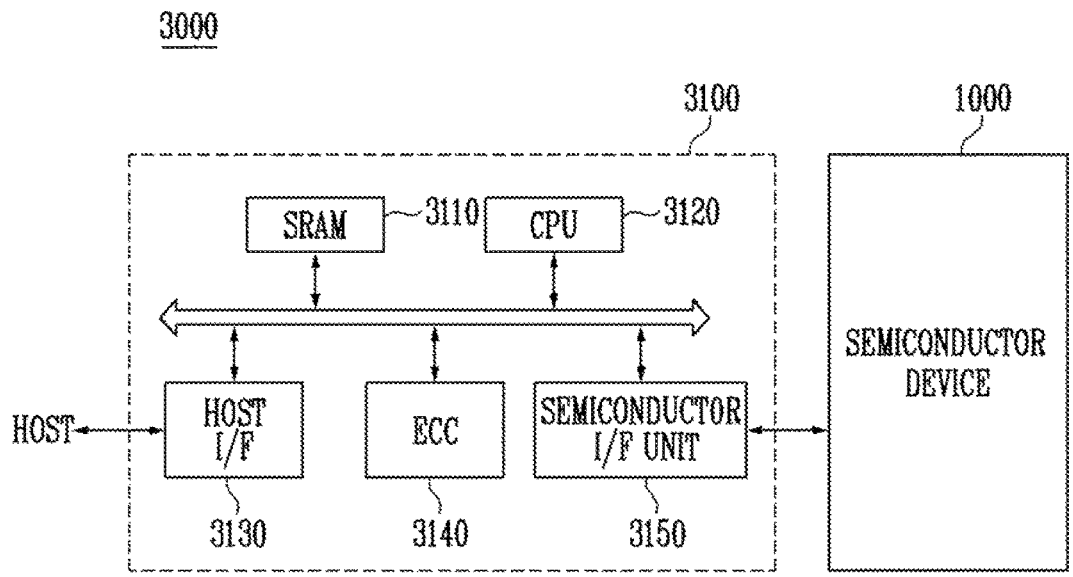
FIG. 12 is a block diagram illustrating a memory system including a semiconductor device according to an exemplary embodiment of the present invention.

FIG. 12 is a block diagram illustrating a memory system including a semiconductor device according to an exemplary embodiment of the present invention.

Referring to FIG. 12, the memory system 3000 according to the exemplary embodiment of the present invention may include a memory controller 3100 and a semiconductor device 1000.

Since the semiconductor device 1000 may substantially have the same construction as FIG. 1, a detailed description for the semiconductor device 1000 will be omitted.

The memory controller 3100 may be configured to control the semiconductor device 1000. An SRAM 3110 may be used as an operating memory of a central processing unit (CPU) 3120. A host interface (I/F) unit 3130 may include a data exchange protocol of the host connected to the memory system 3000. An error correction circuit (ECC) 3140 included in the memory controller 3100 may detect and correct an error included in data read from the semiconductor device 1000. A semiconductor interface (I/F) unit 3150 may interface with the semiconductor device 1000. Further, although not shown in FIG. 12, the memory system 3000 may further include a read only memory (ROM) storing code data for interfacing with the host, etc.

The memory system 3000 according to an exemplary embodiment of the present invention may be applied to a computer, an ultra mobile personal computer (UMPC), a workstation, a net-book, a personal digital assistant (PDA), a portable computer, a web tablet, a wireless phone, a mobile phone, a smart phone, a digital camera, a digital audio recorder, a digital audio player, a digital picture recorder, a digital picture player, a digital video recorder, a digital video player, a device for wirelessly transmitting and receiving information, and various electronic devices configuring a home network.

Figure 13:
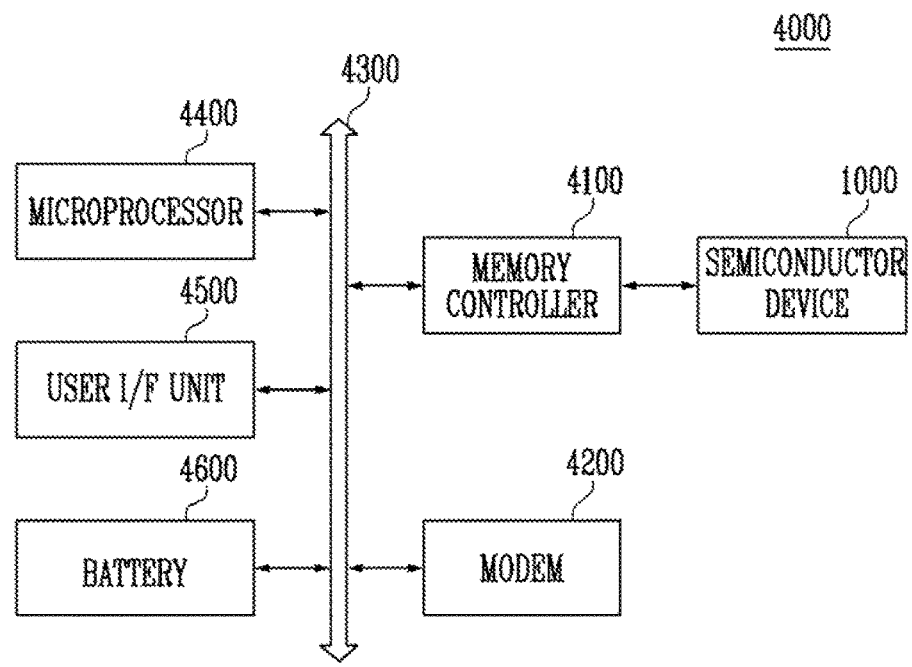
FIG. 13 is a schematic block diagram illustrating a computing system including a semiconductor device according to an exemplary embodiment of the present invention.

FIG. 13 is a schematic block diagram illustrating a computing system including a semiconductor device according to an exemplary embodiment of the present invention.

Referring to FIG. 13, the computing system 4000 according to an exemplary embodiment of the present invention may include a semiconductor device 1000, a memory controller 4100, a modem 4200, a microprocessor 4400, and a user interface (I/F) unit 4500, which are electrically connected to a bus 4300. When the computing system 400 according to an exemplary embodiment of the present invention is a mobile device, a battery 4600 for supplying an operating voltage of the computing system 4000 may be additionally provided. Although not shown in the drawing, an application chip set, a camera image processor (CIS), a mobile DRAM, etc. may be additionally included in the computing system 4000 according to an exemplary embodiment of the present invention.

Since the semiconductor device 1000 may substantially have the same construction as FIG. 1, a detailed description with respect to the semiconductor device 1000 will be omitted.

The memory controller 4100 and the semiconductor device 1000 may configure the SSD.

The semiconductor device 1000 and the memory controller 4100 may be packaged in various types of packages. For example, the semiconductor device and the memory controller may be packaged and mounted in a manner such as a package on package (PoP), a ball grid array (BGA), a chip scale package (CSP), a plastic leaded chip carrier (PLCC), a plastic dual in line package (PDIP), a die in waffle pack (DWP), a die in wafer form (DWF), a chip on board (COB), a ceramic dual in line package (CERDIP), a plastic metric quad flat package (MQFP), a thin quad flat package (TQFP), a small outline integrated circuit (SOIC), a shrink small outline package (SSOP), a thin small outline package (TSOP), a system in package (SIP), a multi chip package (MCP), a wafer-level fabricated package (WFP), a wafer-level processed stack package (WSP), or the like.

Since the present invention may decrease the width of the threshold voltage distributions of the memory cells during the program operation, reliability of the semiconductor device and the memory system including the same may be improved.

The technical spirit of the present invention described above was described with reference to exemplary embodiments in detail, but it should be noted that the embodiments are used for describing the present invention, not limiting its scope. Therefore, it will be understood by those of ordinary skill in the art that various changes in form and detail may be made without departing from the spirit and scope of the present invention as defined by the following claims.

What is claimed is:

1. A method of operating a semiconductor device, comprising:
   performing a program operation on a memory cell so that a threshold voltage of the memory cell is greater than a main verifying voltage,
   wherein, while the program operation is performed and when the threshold voltage of the memory cell is between the main verifying voltage and a pre-verifying voltage that is lower than the main verifying voltage, a bit line voltage applied to a bit line, which is connected to the memory cell, gradually increases based on the number of times a program voltage is applied to a word line connected to the memory cell.

2. The method of claim 1, wherein the program operation is performed in an incremental step pulse program (ISPP) manner.

3. The method of claim 1, wherein the program operation comprises:
   increasing the threshold voltage of the memory cell by applying the program voltage to the word line connected to the memory cell;
   performing a pre-verifying operation using the pre-verifying voltage;
   applying a predetermined bit line voltage to the bit line and programming the memory cell when the threshold voltage of the memory cell is equal to or lower than the pre-verifying voltage, based on a result of the pre-verifying operation;
   performing a main verifying operation using the main verifying voltage when the threshold voltage of the memory cell is greater than the pre-verifying voltage, based on the result of the pre-verifying operation;
   programming the memory cell while gradually increasing the bit line voltage, which is greater than the predetermined bit line voltage, when the threshold voltage of the memory cell is equal to or lower than the main verifying voltage, based on a result of the main verifying operation; and
   applying a program prohibition voltage to the bit line when the threshold voltage of the memory cell is greater than the main verifying voltage, based on the result of the main verifying operation.

4. The method of claim 3, wherein, in the programming of the memory cell while gradually increasing the bit line voltage, the bit line voltage gradually increases in proportion to the number of times the program voltage is applied to the word line.

5. The method of claim 1, wherein the program voltage gradually increases when a pre-verifying operation and a main verifying operation are repeatedly performed.

6. The method of claim 1, wherein, while the program operation on a page in which the memory cell is included is performed, different bit line voltages are applied to bit lines connected to remaining memory cells included in the page based on the number of times the program voltage is applied.

7. A semiconductor device comprising:
   a memory block including a plurality of memory cells;
   a peripheral circuit suitable for performing a program operation on a selected memory cell among the memory cells so that a threshold voltage of the selected memory cell is greater than a main verifying voltage; and
   a control circuit suitable for controlling the peripheral circuit while the program operation is performed when the threshold voltage of the memory cell is between the main verifying voltage and a pre-verifying voltage, which is lower than the main verifying voltage, so that a bit line voltage applied to a bit line connected to the memory cell gradually increases based on the number of times a program voltage is applied to a word line connected to the memory cell.

8. The semiconductor device of claim 7, wherein the control circuit controls the peripheral circuit so that the bit line voltage gradually increases as the number of times the program voltage is applied to the word line increases.

* * * * *